United States Patent
Kruse et al.

(10) Patent No.: US 6,555,745 B1
(45) Date of Patent: Apr. 29, 2003

(54) ELECTRICAL INTERCONNECT BETWEEN AN ARTICULATING DISPLAY AND A PC BASED PLANAR BOARD

(75) Inventors: John M. Kruse, New Brighton, MN (US); Dean Kukson, Pine Island, MN (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 10/053,048

(22) Filed: Oct. 19, 2001

(51) Int. Cl.[7] ............................................. H05K 9/00
(52) U.S. Cl. ..................... 174/35 C; 174/36; 439/67; 439/497
(58) Field of Search ................... 174/35 C, 35 R, 174/36, 254; 439/67, 77, 493, 497; 361/816, 818

(56) References Cited

U.S. PATENT DOCUMENTS

| | | | |
|---|---|---|---|
| 4,812,135 A | * 3/1989 | Smith | 439/493 |
| 4,842,531 A | 6/1989 | Takemura | 439/165 |
| 4,902,236 A | * 2/1990 | Hasircoglu | 439/77 |
| 5,258,866 A | 11/1993 | Ishikawa et al. | 359/88 |
| 5,300,899 A | * 4/1994 | Suski | 333/1 |
| 5,324,315 A | 6/1994 | Grevious | 607/60 |
| 5,328,379 A | 7/1994 | Kobayashi | 439/165 |
| 5,334,800 A | 8/1994 | Kenney | 174/35 R |
| 5,764,476 A | 6/1998 | Ohgami et al. | 361/683 |
| 5,981,870 A | 11/1999 | Barcley et al. | 174/35 |
| 6,172,666 B1 | 1/2001 | Okura | 345/168 |
| 6,225,568 B1 | 5/2001 | Lin et al. | 174/250 |

* cited by examiner

Primary Examiner—Dean A. Reichard
Assistant Examiner—Carmelo Oliva
(74) Attorney, Agent, or Firm—Girma Wolde-Michael

(57) ABSTRACT

A flexible interconnect for electrically connecting a display unit to a data processing unit to facilitate transmission of low voltage differential signals and inhibit electromagnetic interference (EMI). The flexible interconnect includes a conductive layer extending along a plane and an upper and lower insulative layer above and below the conductive layer. The interconnect includes an upper and lower shield layer above and below the upper and lower insulative layer. The flexible interconnect layers form first and second opposing sides orthogonal to the plane of the conductive layer. The interconnect also includes at least two conductive shield members that face the first and second opposing sides of the flexible interconnect layers. The two conductive shield members electrically connect the upper and lower shield layer on each opposing side such that the conductive shield members and the shield layers inhibit EMI about the length of the flexible interconnect.

20 Claims, 2 Drawing Sheets

ELECTRICAL INTERCONNECT BETWEEN AN ARTICULATING DISPLAY AND A PC BASED PLANAR BOARD

FIELD OF THE INVENTION

The present invention generally relates to a flexible cable for coupling a flat panel display with a data processing unit. Specifically, the invention relates to a flexible cable that transmits low voltage differential signals and promotes reduced levels of emissions of electromagnetic radiation.

BACKGROUND OF THE INVENTION

Portable computer displays receive power and electrical signals from the base portion of the portable computer via a flexible cable or circuit board interconnect. The cable or interconnect should be stable and robust enough to withstand many wear and fatigue cycles due to repeated opening and closing cycles without degrading in performance. Where the data rate of transmission with the display is high, such as with low voltage differential signaling (LVDS) used in connection with high-speed video signals, shielding must be supplied around the flexible circuit to protect against electromagnetic interference (EMI). EMI shielding is usually provided by solid ground planes that encase the signaling lines of the cable.

In order to reduce transmission errors induced by noise during data transmission, the cable is usually powered at voltage levels below 3 volts and exhibits impedance levels of over 100 ohms. The ground planes that shield the cable from emitting EMI to the surrounding computer components also control the impedance of the cable. However, use of the solid ground planes reduces cable flexibility and leads to eventual failure of the cable through fatigue caused by the repetitive opening and closing of the portable computer display.

Although it is preferable in low voltage differential signaling to increase the impedance in the cable, the solid ground planes tend to reduce the impedance of the cable. Cable impedance is reduced because of the large capacitance that is generated in the small vertical spacing between the signal lines and the solid ground plane. One approach to increasing the impedance in the cable is to increase the spacing between the signal lines and the solid ground plane, thereby reducing the capacitance. However, the increased spacing increases the overall thickness of the cable and reduces the cable's flexibility. Although operative, such cable construction is impractical for use in certain applications, such as in various portable computers because of the cable size and its predisposition for failure through fatigue.

A cable arrangement and a data processing system that addresses the aforementioned problems, as well as other related problems, are therefore desirable.

SUMMARY OF THE INVENTION

Various embodiments of the present invention are directed to addressing the above and other needs involving a flexible interconnect arrangement for electrically connecting a display unit to a data processing unit that facilitates the transmission of low voltage differential signals and inhibits electromagnetic interference (EMI) along the length of the interconnect arrangement In addition, the flexible interconnect arrangement includes a grounding plane arrangement that results in a thin, highly flexible structure that is resist to early breakdown as a result of fatigue.

According to one embodiment of the invention, a flexible interconnect arrangement transmits low voltage differential signals along a length of the flexible interconnect arrangement and inhibits electromagnetic radiation generated by the signals that travel along the length of the flexible interconnect arrangement. The flexible interconnect arrangement includes a conductive layer extending along a plane in the direction of the length of the flexible interconnect arrangement and an upper insulative layer and a lower insulative layer respectively above and below the conductive layer. The interconnect arrangement further includes an upper shield layer and lower shield layer above and below the upper insulative layer and the lower insulative layer. The flexible interconnect arrangement layers form at least first and second opposing sides orthogonal to the plane of the conductive layer. The interconnect arrangement also includes at least two conductive shield members that face the first and second opposing sides of the flexible interconnect arrangement layers and electrically connect the upper shield layer and the lower shield layer on each opposing side. The conductive shield members and the shield layers inhibit EMI about the length of the flexible interconnect arrangement.

The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
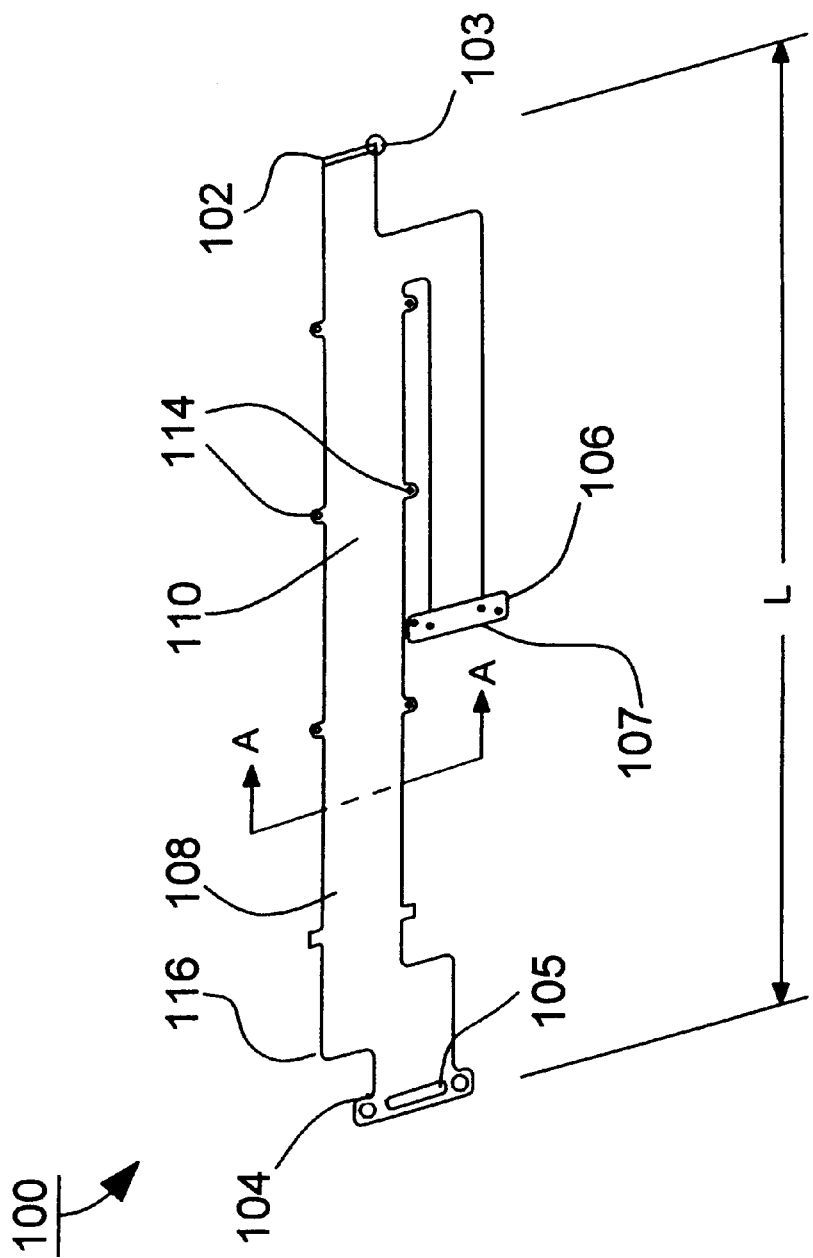
FIG. 1 illustrates a flexible interconnect arrangement for use in a data processing arrangement according to an example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to an arrangement and system for a flexible interconnect arrangement for electrically connecting a display unit to a data processing unit that facilitates the transmission of low voltage differential signals and inhibits electromagnetic interference (EMI) along the length of the flexible interconnect arrangement. While the present invention is not necessarily limited to such an application, the invention will be better appreciated using a discussion of example embodiments in such a specific context.

In an example embodiment, a flexible interconnect arrangement (FIA) facilitates low voltage differential signal communications between an analyzer and a display screen with a highly flexible, high impedance circuit board structure. Meeting the high impedance requirement of the flexible interconnect arrangement requires using solid ground planes that are sufficiently spaced apart from the copper traces to ensure a high impedance. This approach increases the thickness of the interconnect arrangement and makes it impractical for use with portable display units. The FIA meets the needs for high impedance and high flexibility by using upper and lower conductive mesh structures as shields on either side of an insulated copper tracings layer instead of the more highly conductive solid ground planes. The lower impedance of the mesh shield layers allows the shield layers to be closer to the copper tracings layer, therein reducing the thickness of the FIA. In addition, the arrangement of and the type of dielectric material used in the insulative layers immediately above and below form a high impedance structure that allows the shield layers to be disposed closer to the copper tracings layer. The mesh shield layers are electrically connected with each other with conductive vias at various points along the length of the FIA to form an EMI shield that extends the length of the FIA.

FIG. 1 illustrates a flexible interconnect arrangement (FIA) 100 for use in a data processing arrangement according to an example embodiment of the invention. One example of the data processing arrangement includes an implanted medical device programming unit that uses flexible interconnect arrangement (FIA) 100 to electrically connect a programming unit display screen with an analyzer of the programming unit (not shown). A first end 102 of flexible interconnect arrangement 100 connects to the display screen via a connector 103. A second end 104 connects to the analyzer of the programming unit via a connector 105. In this example embodiment, FIA 100 includes a third end 106 that connects to a circuit board in the display screen via connector 107. Third end 106 of FIA 100 enables the audio circuits located in the display screen area as well as the touch screen capabilities of the display screen. For a more detailed discussion of the components and functionality of an implant programming unit reference can be made to U.S. Pat. No. 5,324,315 to Grevious, which is assigned to the assignee of the present invention and is incorporated herein by reference.

In this example embodiment, FIA 100 has a predetermined length L that extends from first end 102 to second end 104 of FIA 100. FIA 100 transmits a series of low voltage differential signals along the length L from the analyzer to the display screen. During signal transmission, FIA 100 shields the display and the analyzer from electromagnetic interference (EMI) that the differential signals generate as they travel the length of FIA 100. A polymide coating material coats an upper surface 110 and a lower surface 112 of FIA 100. FIA 100 includes sets of conductive vias 114 that are located along the length of FIA 100. FIA 100 includes an upper shield member and a lower shield member (not shown), both of which extend laterally along the length L of FIA 100, that combine with vias 114 to form an EMI shield that extends along the length of FIA 100. Spacing between vias 114 along the length L of FIA 100 is about ¼ the wavelength of the transmitted signals. The EMI shielding capability diminishes as the spacing between vias 114 increases. The configuration of the present invention effectively forms an EMI sleeve around FIA 100.

Figure 2:
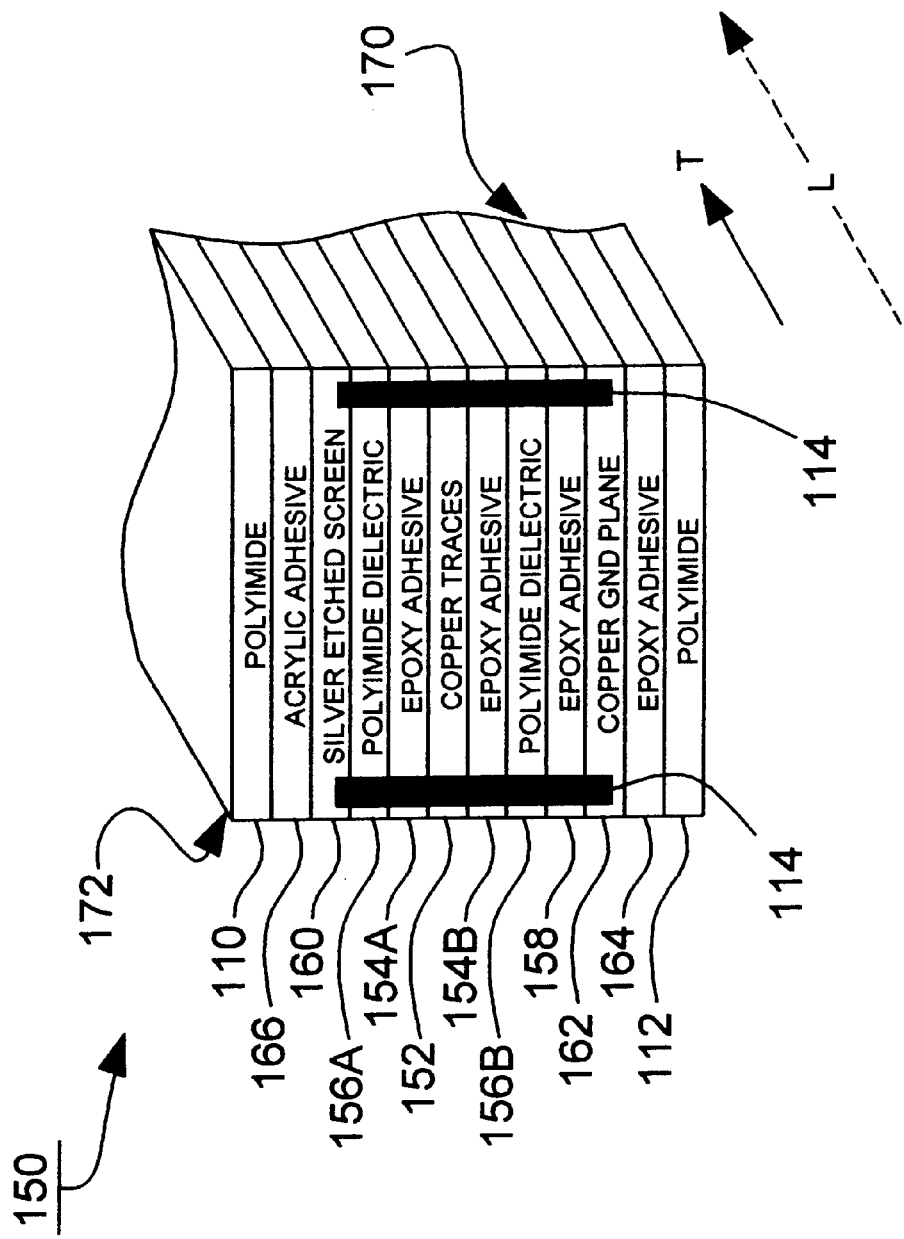
FIG. 2 illustrates a cross section of the flexible interconnect arrangement of FIG. 1 according to an example embodiment of the invention.

The description in connection with FIG. 2 provides a more detailed discussion of the cross section of FIA 100 taken across line A—A that includes the upper and lower shield members that form the EMI shield of the present invention.

FIG. 2 illustrates a cross section 150 of flexible interconnect arrangement 100 of FIG. 1 according to an example embodiment of the invention. Cross section 150 illustrates a copper tracings layer 152 disposed between two sets of insulative layers and two shielding layers that form the basic structure of FIA 100. The manner of arranging the insulative layers, the types of materials used in the insulative layers and the structure of the individual shielding layers in combination produce a highly flexible interconnect arrangement with high impedance.

Cross section 150 is labeled with the letter T indicating the direction of signal transmission on FIA 100. FIA 100 includes conductive layer 152 comprised of copper tracings that extends along a plane that is parallel to T and extends in the direction of length L of FIA 110. Conductive layer 152 has about 0.25 ounces of copper by weight. FIA 100 includes an upper insulative layer 154A disposed above conductive layer 152 and a lower insulative layer 154B disposed below conductive layer 152. In this example, the upper and lower insulative layers are formed from an epoxy adhesive having a dielectric constant of about 4.8. Upper insulative layer 154A has a thickness of about 0.033 mm while lower insulative layer 154B has a thickness of about 0.018 mm.

FIA 100 includes a second upper insulative layer 156A disposed above layer 154A and a second lower insulative layer 156B disposed below layer 154B. In this example, second upper and lower insulative layers 156A and 156B are formed of a polymide dielectric having a thickness of about 0.025 mm, respectively. The polyimide dielectric material has a dielectric constant of about 4.2. FIA 100 includes an additional lower insulative layer 158 that is disposed below insulative layer 156B. Insulative layer 158 is formed from an epoxy adhesive and has a thickness of about 0.018 mm.

FIA 100 further includes an upper conductive shield layer 160 disposed above layer 156A and a lower conductive shield layer 162 disposed below layer 158. In this example, upper shield layer 160 is comprised of an ultra fine silver etched mesh screen having a thickness of about 0.0015 in. On the other side, lower shield layer 162 is comprised of a copper ground plane formed from a copper mesh having a thickness of about 0.0015 in. The mesh structures of shield layers 160 and 162 form faraday shields about FIA 100 that provide a high degree of flexibility to FIA 100 while exhibiting a lower impedance than normal solid ground planes. As discussed above, the lower impedance of the shield layers facilitates locating the shield layers closer to each other and to the copper traces. The dielectric constant of the materials used in insulative layers 154–158 also contributes to forming a thin and flexible interconnect that has the high impedance needed for low voltage differential signaling.

In this example embodiment, a set of insulative layers having a combined thickness of less than 0.070 millimeters separate conductive layer 152 and upper shield layer 160 and exhibit an impedance of about 100 ohms. Similarly, another set of insulative layers separate conductive layer 152 and lower shield layer 162 and exhibit an impedance of about 100 ohms.

FIA 100 further includes insulative layers above and below shield layers 160 and 162. In this example embodiment, the insulative layer above shield layer 160 is comprised of an acrylic adhesive layer 166 having a thickness of about 0.030 mm and polymide layer 110 having a thickness of about 0.025 mm. The insulative layer below shield layer 162 is comprised of an epoxy adhesive layer 164 having a thickness of about 0.033 mm and polymide layer 112 having a thickness of about 0.025 mm. The layers of FIA 100 form a layered structure having a first sidewall 170 and a second sidewall 172. Sidewalls 170 and 172 are orthogonal to the plane formed by conductive layer 152 and extend the length of FIA 100 in the direction of T.

In forming an EMI shield about FIA 100, shield layers 160 and 162 are electrically connected together with at least two conductive shield members 114 disposed on sidewalls 170 and 172, respectively. In this example embodiment, shield members 114 are conductive vias that extend from shield layer 160 down to shield layer 162. As seen in FIG. 1, each set of conductive vias 114 are spaced laterally along the length of FIA 100. The two conductive shield members 114 electrically connect upper shield layer 160 and lower shield layer 162 on each opposing side of FIA 100 such that the conductive shield members and the flexible interconnect arrangement layer inhibit EMI about the length of FIA 100. Vias 114 are formed of copper but can be formed from silver. Vias 114 are not limited to formed metallic structures and can include metallic elements that are adhered to shield layers 160 and 162.

In another embodiment of the present invention, the flexibility of FIA 100 increases upon substituting copper mesh ground plane 162 with a silver etched screen similar to layer 160 of FIG. 2. To reduce cost of FIA 100, silver etched screen layer 160 is substitutable with a copper mesh ground plane similar to layer 162 of FIG. 2.

In another embodiment, insulative layers 154A and 156A are substitutable with a single layer of polyimide dielectric, or a similar dielectric material, as long as the single polyimide layer has a similar dielectric constant as that of the combined layers 154A and 156A. Layers 154B and 156B, likewise, are substitutable with a single dielectric layer having a dielectric constant similar to the combined layers 154B and 156B.

The adhesives used in the above described embodiments include, but are not limited to, butyralthenolic, acrylic polyimide, PEI, nitriale phenolic and aramide. Materials having similar dielectric characteristics and adherence to metallic materials following standard IPC-FC 242 (Institute for Packaging Electronic Circuits) can also be used in variations of the described embodiments. In one example application, the epoxy adhesive has a dielectric constant of about 4.8. The polyimide layers 110 and 112 have a dielectric constant of about 4.2. Similar materials that are used as cover layers for coating circuit boards can be found in standard IPC 232.

The present invention provides a benefit of forming flexible interconnect arrangements of different shapes. Referring briefly to FIG. 1, an "S" configuration 116 can be formed in FIA 100 to accommodate the hardware design of the display screen and the analyzer unit. In one example embodiment, the conductive tracings have linewidths of 0.0036 in. and spacings of 0.006 in.

The present invention is applicable to the various data processing arrangements including, but not limited to, personal notebook and handheld computers, PDAs and wireless communication devices. Display screens include LCD, electroluminescent or any other thin film display technology. The display screen can also include touch-sensitivity capability enabling the user to interact with the data processing arrangement using a stylus or a user's hand.

Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A flexible interconnect arrangement (FIA) adapted to transmit low voltage differential signals along a length of the FIA and inhibit electromagnetic radiation generated as the signals travel along the length of the FIA, the FIA comprising:

a conductive layer extending parallel to a plane along the length of the FIA, an upper insulative layer and a lower insulative layer respectively above and below the conductive layer, and an upper shield layer and lower shield layer respectively above and below the upper insulative layer and the lower insulative layer, said layers forming at least first and second opposing sides orthogonal to the plane of the conductive layer; and at least two conductive shield members adapted to face the respective first and second opposing sides of said layers and to electrically connect the upper shield layer and the lower shield layer on each opposing side, respectively, wherein the conductive shield members and the shield layers are adapted to inhibit EMI about the length of the FIA.

2. The FIA of claim 1, wherein the conductive shield members are comprised of a plurality of sets of conductive vias adapted to be located along the length of the FIA.

3. The FIA of claim 1, wherein the upper shield layer is comprised of an ultra fine mesh.

4. The FIA of claim 3, wherein the ultra fine mesh is comprised of a silver etched screen.

5. The FIA of claim 1, wherein the lower shield layer is comprised of a grounding mesh plane.

6. The FIA of claim 5, wherein the grounding mesh plane is comprised of a copper material.

7. The FIA of claim 1, wherein the conductive layer is comprised of copper traces.

8. The FIA of claim 1, wherein the conductive layer and the upper shield layer are separated by at least two insulative layers having a combined thickness of less than 0.070 millimeters and exhibit an impedance of about 100 ohms.

9. The FIA of claim 1, further comprising a second upper insulative layer above the upper shield layer and a second lower insulative layer below the lower shield layer.

10. The FIA of claim 2, wherein the conductive vias have a spacing along the length of the FIA of about ¼ of the wavelength of the low voltage differential signals.

11. A data processing arrangement comprising:

a display unit;

a data processing unit; and a flexible interconnect arrangement (FIA) adapted to be coupled between the display unit and the data processing unit and transmit low voltage differential signals to the display unit along a length of the flexible interconnect arrangement, wherein the flexible interconnect arrangement includes:

a conductive layer extending parallel to a plane along the length of the FIA, an upper insulative layer and a lower insulative layer respectively above and below the conductive layer, and an upper shield layer and lower shield layer respectively above and below the upper insulative layer and the lower insulative layer, said layers forming at least first and second opposing sides orthogonal to the plane of the conductive layer; and at least two conductive shield members adapted to face the first and second opposing sides of said layers respectively and to electrically connect the upper shield layer and the lower shield layer on each opposing side, respectively, wherein the conductive shield members and the shield layers are adapted to inhibit EMI about the length of the FIA.

12. The data processing arrangement of claim 11, wherein the flexible interconnect arrangement further includes a portion adapted to be coupled to the display unit and enable an audio circuit and a touch screen circuit disposed in the display unit.

13. The data processing arrangement of claim 11, wherein the upper shield layer is comprised of an ultra fine conductive mesh adapted to provide a high radius of flexibility, therein alleviating the fatigue in the FIA caused by movement of the display unit.

14. The data processing arrangement of claim 11, wherein the conductive shield members include conductive vias have a spacing along the length of the FIA of about ¼ of the wavelength of the transmitted signals, wherein the conductive vias and the upper and lower shield layers form an EMI shield about the FIA.

15. The data processing arrangement of claim 13, wherein the lower shield layer is comprised of a copper mesh grounding plane.

16. The data processing arrangement of claim 11, wherein the data processing unit includes an implant programming unit.

17. A cable arrangement for use with a data processing arrangement comprising;
   a first end adapted to be coupled to a display unit;
   a second end adapted to be coupled to a data processing unit; and
   a flexible interconnect arrangement (FIA) adapted to be coupled to the first and second ends and transmit low voltage differential signals along a length of the FIA, wherein the flexible interconnect arrangement includes:
   a conductive layer extending along a plane in the direction of the length of the FIA, an upper insulative layer and a lower insulative layer respectively above and below the conductive layer, and an upper shield layer and lower shield layer above and below the upper insulative layer and the lower insulative layer, said layers forming at least first and second opposing sides orthogonal to the plane of the conductive layer; and
   at least two conductive shield members adapted to face the first and second opposing sides of said layers and to electrically connect the upper shield layer and the lower shield layer on each opposing side, respectively, wherein the conductive shield members and the shield layers are adapted to inhibit EMI about the length of the FIA.

18. The cable arrangement of claim 17, wherein the conductive shield members of the FIA include conductive vias have a spacing along the length of the FIA of about ¼ of the wavelength of the low voltage differential signals, wherein the conductive vias and the upper and lower shield layers form an EMI shield about the FIA.

19. The cable arrangement of claim 17, wherein the upper shield layer of the FIA is comprised of an ultra fine conductive mesh.

20. The cable arrangement of claim 17, further comprising a second upper insulative layer above the upper shield layer and a second lower insulative layer below the lower shield layer of the FIA.

* * * * *

UNITED STATES PATENT AND TRADEMARK OFFICE
CERTIFICATE OF CORRECTION

PATENT NO. : 6,555,745 B1 Page 1 of 1
APPLICATION NO. : 10/053048
DATED : April 29, 2003
INVENTOR(S) : John M. Kruse et al.

It is certified that error appears in the above-identified patent and that said Letters Patent is hereby corrected as shown below:

Col. 6, Line 42, delete "claim 2," and insert --claim 1,--.

Signed and Sealed this

Eighteenth Day of July, 2006

JON W. DUDAS
*Director of the United States Patent and Trademark Office*